US010040280B2

(12) United States Patent
Van Brocklin (10) Patent No.: US 10,040,280 B2
(45) Date of Patent: Aug. 7, 2018

(54) PRINTHEAD CIRCUIT WITH TRIMMING

(71) Applicant: Xaar Technology Limited, Cambridge (GB)

(72) Inventor: Andrew L Van Brocklin, Corvallis, OR (US)

(73) Assignee: XAAR TECHNOLOGY LIMITED, Cambridge (GB)

( * ) Notice: Subject to any disclaimer, the term of this patent is extended or adjusted under 35 U.S.C. 154(b) by 0 days.

(21) Appl. No.: 15/509,761

(22) PCT Filed: Sep. 10, 2015

(86) PCT No.: PCT/GB2015/052610
§ 371 (c)(1),
(2) Date: Mar. 8, 2017

(87) PCT Pub. No.: WO2016/038367
PCT Pub. Date: Mar. 17, 2016

(65) Prior Publication Data
US 2017/0259562 A1  Sep. 14, 2017

(30) Foreign Application Priority Data
Sep. 10, 2014  (GB) .................................. 1415991.7

(51) Int. Cl.
*B41J 2/045* (2006.01)
*H03K 3/356* (2006.01)
(52) U.S. Cl.
CPC ....... *B41J 2/04541* (2013.01); *B41J 2/04586* (2013.01); *B41J 2202/13* (2013.01); *H03K 3/356* (2013.01)

(58) Field of Classification Search
CPC .. B41J 2/04541; B41J 2/04586; B41J 2/0459; B41J 2/0452; B41J 2/04545; B41J 2202/13; B41J 2/04588; H03K 3/356
See application file for complete search history.

(56) References Cited

U.S. PATENT DOCUMENTS 5,453,767 A   9/1995 Chang et al.
6,276,772 B1  8/2001 Sakata et al.
(Continued)

FOREIGN PATENT DOCUMENTS

JP   S61 209166 A   9/1986
JP   H 068428 A    1/1994
(Continued)

OTHER PUBLICATIONS

Search Report dated Mar. 11, 2015 for GB Application No. 1415986.7, 5 pages.
(Continued)

*Primary Examiner* — Thinh H Nguyen
(74) *Attorney, Agent, or Firm* — Patterson Thuente Pedersen, P.A.

(57) ABSTRACT

A printhead circuit or driving at least two actuating elements has a trim generating circuit for generating a trim signal using a comparator coupled to receive and compare feedback indicative of a present level of a drive voltage, with a configurable reference voltage value. The trim being based on a drive voltage feedback can give a more direct indication of actuating element output than given by timing references. Hence the trim can be more accurate, can be simpler, without accurate digital timing references, and thus costs can be reduced. It can be combined with a cold switch arrangement.

10 Claims, 10 Drawing Sheets

(56) References Cited

U.S. PATENT DOCUMENTS

| | | |
|---|---|---|
| 9,399,342 B2 | 7/2016 | Marchant |
| 9,579,890 B2 | 2/2017 | Marchant et al. |
| 2001/0026292 A1 | 10/2001 | Ishizaki |
| 2002/0145639 A1 | 10/2002 | Masuda et al. |
| 2003/0234826 A1 | 12/2003 | Hosono et al. |
| 2005/0041073 A1 | 2/2005 | Fontaine et al. |
| 2005/0200639 A1 | 9/2005 | Kobayashi et al. |
| 2005/0231179 A1 | 10/2005 | Ishizaki |
| 2006/0092201 A1 | 5/2006 | Gardner |
| 2007/0296771 A1 | 12/2007 | Ou et al. |
| 2008/0186339 A1 | 8/2008 | Kondoh |
| 2008/0238969 A1 | 10/2008 | Kasai |
| 2009/0033306 A1 | 2/2009 | Tanzawa |
| 2009/0207200 A1 | 8/2009 | Tamura |
| 2009/0212831 A1 | 8/2009 | Kondoh |
| 2010/0097114 A1 | 4/2010 | Miyazaki et al. |
| 2010/0171778 A1 | 7/2010 | Ozawa |
| 2010/0328380 A1 | 12/2010 | Oshima |
| 2011/0063009 A1 | 3/2011 | Tseng |
| 2011/0273498 A1 | 11/2011 | Kasai et al. |
| 2012/0249638 A1 | 10/2012 | Takano et al. |
| 2012/0262512 A1 | 10/2012 | Oshima et al. |
| 2013/0057610 A1 | 3/2013 | Van Brocklin |
| 2013/0321507 A1 | 12/2013 | Mardilovich et al. |
| 2014/0098149 A1* | 4/2014 | Endo .................. B41J 2/04581 347/10 |
| 2014/0152726 A1 | 6/2014 | Van Brocklin et al. |
| 2014/0210884 A1 | 7/2014 | Rosario et al. |
| 2015/0197083 A1 | 7/2015 | Otsuka et al. |
| 2015/0336383 A1 | 11/2015 | Otsuka et al. |
| 2016/0067960 A1 | 3/2016 | Marchant et al. |
| 2016/0067963 A1 | 3/2016 | van Brocklin et al. |

FOREIGN PATENT DOCUMENTS

| | | |
|---|---|---|
| JP | 2004-17534 | 1/2004 |
| JP | 2006 240167 A | 9/2006 |
| WO | WO 2010/055345 A1 | 5/2010 |

OTHER PUBLICATIONS

Search Report dated Mar. 9, 2015 for GB Application No. 1415987.5, 5 pages.
Search Report dated Mar. 11, 2015 for GB Application No. 1415988.3, 6 pages.
Office Action dated Aug. 24, 2017 for Japanese Application No. 2015177745, 9 pages.
Office Action dated Dec. 20, 2016 for Japanese Application No. 2015178198, 9 pages.
Application and File history for U.S. Appl. No. 14/850,303, filed Sep. 10, 2015. Inventors: Marchant.
Application and File history for U.S. Appl. No. 14/850,204, filed Sep. 10, 2015. Inventors: van Brocklin et al.
Application and File history for U.S. Appl. No. 14/850,153, filed Sep. 10, 2015. Inventors: Marchant et al.
International Search Report and Written Opinion for PCT/GB2015/052610, dated Nov. 25, 2015, 13 pages.
Combined Search and Examination Report for GB 1415991.7, dated Mar. 9, 2015, 5 pages.

* cited by examiner

PRINTHEAD CIRCUIT WITH TRIMMING

RELATED APPLICATIONS

The present application is a National Phase entry of PCT Application No. PCT/GB2015/055610, filed Sep. 10, 2015, which claims priority from GB Patent Application No. 1415991.7, filed Sep. 10, 2014, said applications being hereby incorporated by reference herein in their entirety.

TECHNICAL FIELD

The present invention relates to printhead circuits, to print systems, and to integrated circuits for such printer systems.

BACKGROUND

It is known to provide printhead circuits for printers such as inkjet printers. For example, the inkjet industry has been working on how to drive piezoelectric (piezo) printhead actuating elements for more than twenty years. Multiple drive methods have been produced and there are multiple different types in use today. Some are briefly discussed now.

Hot Switch: This is the class of driving methods that keep the demux function and the power dissipation ($CV^2$) in the same driver IC. This was the original drive method, before cold switch became popular.

Rectangular Hot Switch: This describes hot switch systems that have no flexible control over rise and fall time and only two voltages (0V and 30V for example). In some cases waveform delivery is uniform to all the actuating elements. The waveform has some level of programmability.

DAC Hot Switch describes a class of drive options that has a logic driving an arbitrary digital value stream to a DAC per actuating element, and outputs a high voltage drive power waveform scaled from this digital stream. In terms of driving flexibility, this option has the most capability. It is limited only by the number of digital gates and the complexity that system designers can use and/or tolerate.

Cold Switch Demux: This describes an arrangement in which all actuating elements are fed the same drive signal through a pass gate-type demultiplexer. The drive signal can be gated at sub-pixel speeds.

It is also known to provide some factory calibration of differences between individual actuating elements and to provide compensation by trimming the drive signal applied to the different actuating elements.

SUMMARY

Embodiments of the invention can provide improved apparatus or methods or computer programs. According to a first aspect of the invention, there is provided a printhead circuit for driving at least two actuating elements and comprising a trim generating circuit and a trimming circuit, the trim generating circuit being configured to generate a trim signal for trimming a drive voltage of at least one of the actuating elements relative to others of the actuating elements, the trim generating circuit having a comparator coupled to receive and compare feedback indicative of a present level of a drive voltage, with a configurable reference voltage value for the at least one of the actuating elements, and the trim generating circuit being configured to generate the trim signal according to the comparison, the trimming circuit being coupled to receive the trim signal and being configured to trim the drive voltage of the respective at least one of the actuating elements according to the trim signal. A benefit of the trim being based on a drive voltage feedback is that this can give a more direct indication of actuating element output than relying on timing alone, in which case the actuating element output also depends on how consistent a drive voltage slope may be. Hence the trim can be more accurate. Also, compared to a trim based on timing, circuitry can be simpler, since there is no need for accurate digital timing references and timers, and thus costs can be reduced. Where higher accuracy is required, this cost difference can become even more marked. Note that the drive voltage feedback can encompass any signal which can indicate the drive voltage level, including for example the output of an amplifier, or feedback to an amplifier, or a voltage drop across an actuating element or across a sense resistor for example. See FIG. 1 for example.

Any additional features can be added to any of the aspects, or disclaimed, and some such additional features are described and some set out in dependent claims. One such additional feature is the comparator comprising an analog comparator circuit arranged to receive the feedback as an analog signal and having a digital to analog converter for converting the reference voltage value into an analog signal for input to the analog comparator. This can help reduce an amount of circuitry particularly where high accuracy is needed which would otherwise use more digital circuitry, and helps avoid the need to convert the feedback into digital form. Hence it can help reduce costs and circuit space requirements. See FIG. 2 for example.

Another such additional feature is a switch for applying a drive signal to cause the drive voltage across the actuating element, and a control circuit for controlling the switch according to a print signal and according to the trim signal. This combination with a so called cold switch arrangement is a relatively efficient way to implement the voltage adjustment according to the trim signal without too much additional circuitry or power dissipation. See FIG. 3 for example.

Another such additional feature is the control circuit being arranged to adjust a timing of the switch control according to the trim signal. This is a convenient way of trimming the drive voltage provided there is a slope on the drive voltage waveform. Other ways can also be envisaged, such as adjusting the amplitude or slope of pulses in the drive signal for example. See FIG. 3 and FIGS. 8 and 9 for example.

Another such additional feature is the drive signal being a common drive signal for a multiple of the actuating elements and the switch being provided one per actuating element, to switch the common drive signal to a respective one of the actuating elements. This arrangement can help simplify the circuitry and reduce its power dissipation, and benefits from the per-actuating element trimming since there is a common drive signal. See FIG. 3 for example.

Another such additional feature is the trim generating circuit comprising a store such as a memory device for providing a static trim value, and a circuit for combining the static trim value with a dynamic trim value. This can help enable more accurate trimming. See FIG. 4 for example. The static trim value may be stored during manufacture of the printhead.

Another such additional feature is the trim generating circuit having a dynamic trim circuit configured to receive a sub-drop timing signal and to generate the dynamic trim value as a sequence of values corresponding to a sequence of sub-drops within a drop, according to the sub-drop timing signal. This is a convenient way of implementing sub-drops and using some of the same circuitry as is used for trimming, to reduce a quantity of circuitry and thus reduce costs and reduce power dissipation. See FIG. 5 for example.

Another such additional feature is the printhead circuit being incorporated in a printer assembly for the printer, the printer assembly having a common drive circuit for generating the drive voltage for a multiple of actuating elements, or for a multiple of printheads, each printhead comprising a multiple of actuating elements. See FIG. 3 or FIG. 7 for example.

Another such additional feature is the feedback being coupled from the common drive circuit for generating the drive voltage. This is a convenient source of the feedback. See any of FIGS. 1 to 7 for example.

Another aspect provides an integrated circuit for the printhead and comprising a trim generating circuit for generating a trim signal for adjusting a drive voltage across at least one of the actuating elements relative to another of the actuating elements, the trim generating circuit having a comparator coupled to receive and compare feedback indicative of a present level of the drive voltage, with a configurable reference value relating to the at least one of the actuating elements, and to output a comparison result, the trim generating circuit being configured to generate the trim signal according to the comparison result, for use in adjusting the drive voltage.

Numerous other variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION

The present invention will be described with respect to particular embodiments and with reference to drawings but note that the invention is not limited to features described, but only by the claims. The drawings described are only schematic and are non-limiting. In the drawings, the size of some of the elements may be exaggerated and not drawn to scale for illustrative purposes.

Definitions:

Where the term "comprising" is used in the present description and claims, it does not exclude other elements or steps and should not be interpreted as being restricted to the means listed thereafter. Where an indefinite or definite article is used when referring to a singular noun e.g. "a" or "an", "the", this includes a plural of that noun unless something else is specifically stated.

References to programs or software can encompass any type of programs in any language executable directly or indirectly on any computer.

References to computer or circuit or circuitry or processor are intended to encompass any kind of processing hardware which can be implemented in any kind of logic or analog circuitry, integrated to any degree, and not limited to general purpose processors, digital signal processors, ASICs, FPGAs, discrete components or logic and so on, and are intended to encompass implementations using multiple processors which may be integrated together, or co-located or distributed at different locations for example.

References to actuating elements are intended to encompass any kind of actuating element for ejecting any kind of fluid from a fluid reservoir for printing 2D images or 3D objects for example, onto any kind of media, the actuating elements having actuators for causing the ejection in response to an applied electrical voltage or current.

References to actuators are intended to encompass any kind of actuator for such actuating elements, including but not limited to piezoelectric actuators typically having a predominantly capacitive circuit characteristic or electro thermal actuators typically having a predominantly resistive circuit characteristic.

References to groups or banks of the actuating elements are intended to encompass linear arrays of neighbouring actuating elements, or 2-dimensional rectangles or other patterns of neighbouring actuating elements, or any pattern or arrangement, regular or irregular or random, of neighbouring or non-neighbouring actuating elements.

Figure 1:
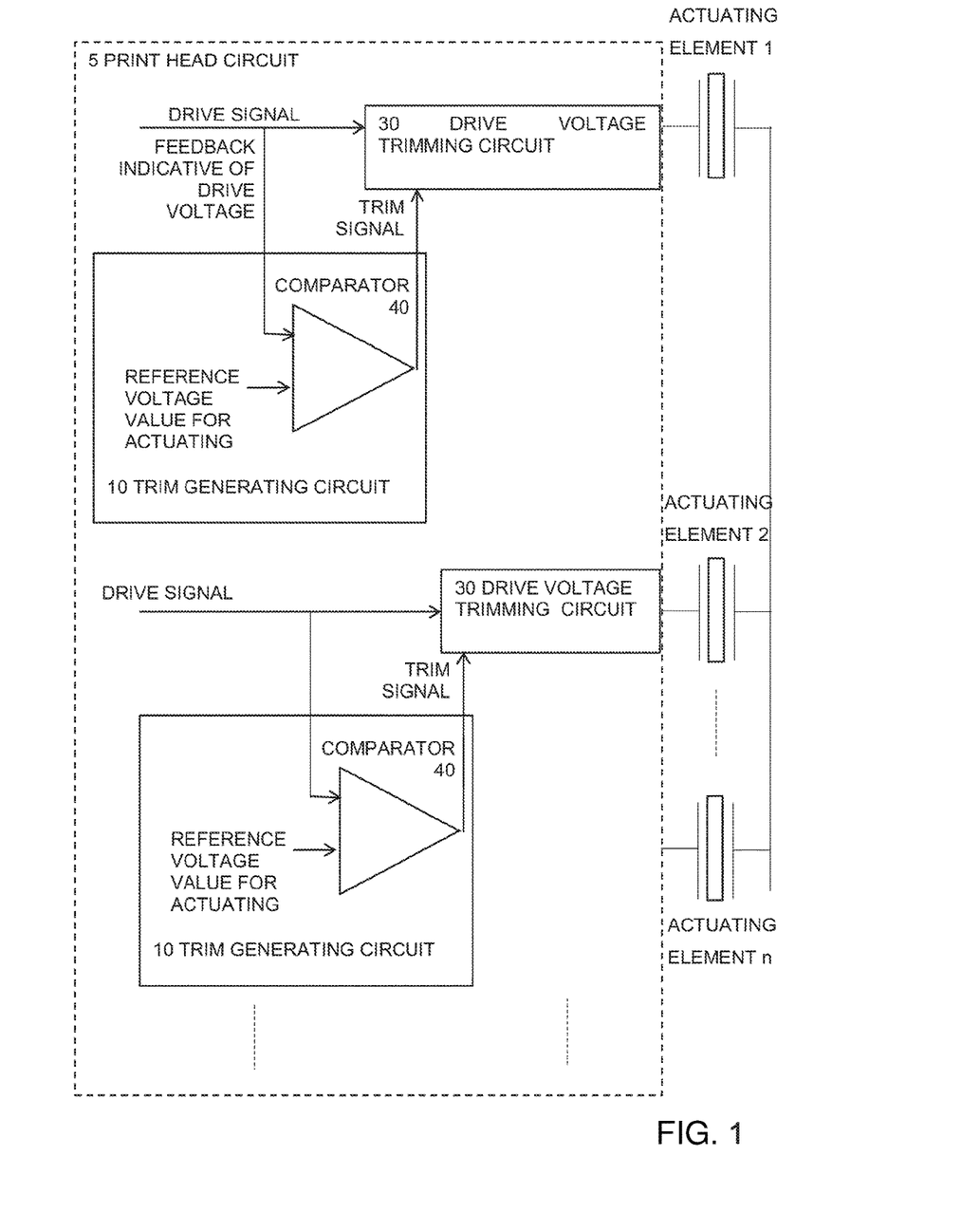
FIG. 1 shows a schematic view of a printhead circuit according to an embodiment

FIG. 1, printhead circuit according to an embodiment

Embodiments are concerned with how to control the voltage on an inkjet printhead actuating element at a low cost, with fine voltage resolution and without requiring high resolution timing signals. Previously, either no trimming was carried out, or trimming was carried out using a hot switch approach, with pulse width control, or an amplifier with voltage control.

FIG. 1 shows a schematic view of parts of a printhead circuit 5 according to an embodiment. Dashed lines indicate the possibility of repeating components for additional actuation elements. A trim generating circuit 10 is provided, which outputs a trim signal to a drive voltage trimming circuit 30 for each actuating element. Actuating elements 1 and 2 are shown. There may be many more, arranged in groups or banks for example, and they may be inkjet or any other technology for producing a dot or group of dots, driven electrically by actuators such as piezoelectric or other technology such as thermo-electric or electro-magnetic for example. The drive voltage trimming circuits can optionally be integrated with the actuating element or be part of a drive signal generating part of the printhead circuit, or be partly on and partly off the printhead circuit for example. Separate drive signals are shown for each actuating element to indicate that these drive signals can either be generated separately, on or off the printhead circuit, or a common drive signal generator can be provided (not shown in this view), either on or off the printhead circuit.

The trim generating circuit 10 for the first actuating element has an input for receiving a feedback signal indicative of drive voltage across the respective actuator, and this is fed to one input of a comparator 40. A reference voltage value for actuating element 1 is provided. This can be provided from a stored value or input from a source external to the trim generating circuit or external from the printhead circuit for example. The result of the comparison can indicate when the drive voltage has reached a desired level. This result can be used to generate the trim signal, either directly or with some intermediate circuitry. The trim signal provides an indication of how the drive signal should be fine-tuned and can be used to control the drive voltage trimming circuit in any way, to provide some compensation for differences between the actuating elements or their drive circuits, to enable a more consistent print output. The trim signal can provide that indication in the timing of a transition, or in a signal level or in the form of a digital value for example. The trim signal can be subject to filtering or scaling or other processing for example before it is used. A trim generating circuit 10 is also shown for the second actuating element.

Figure 2:
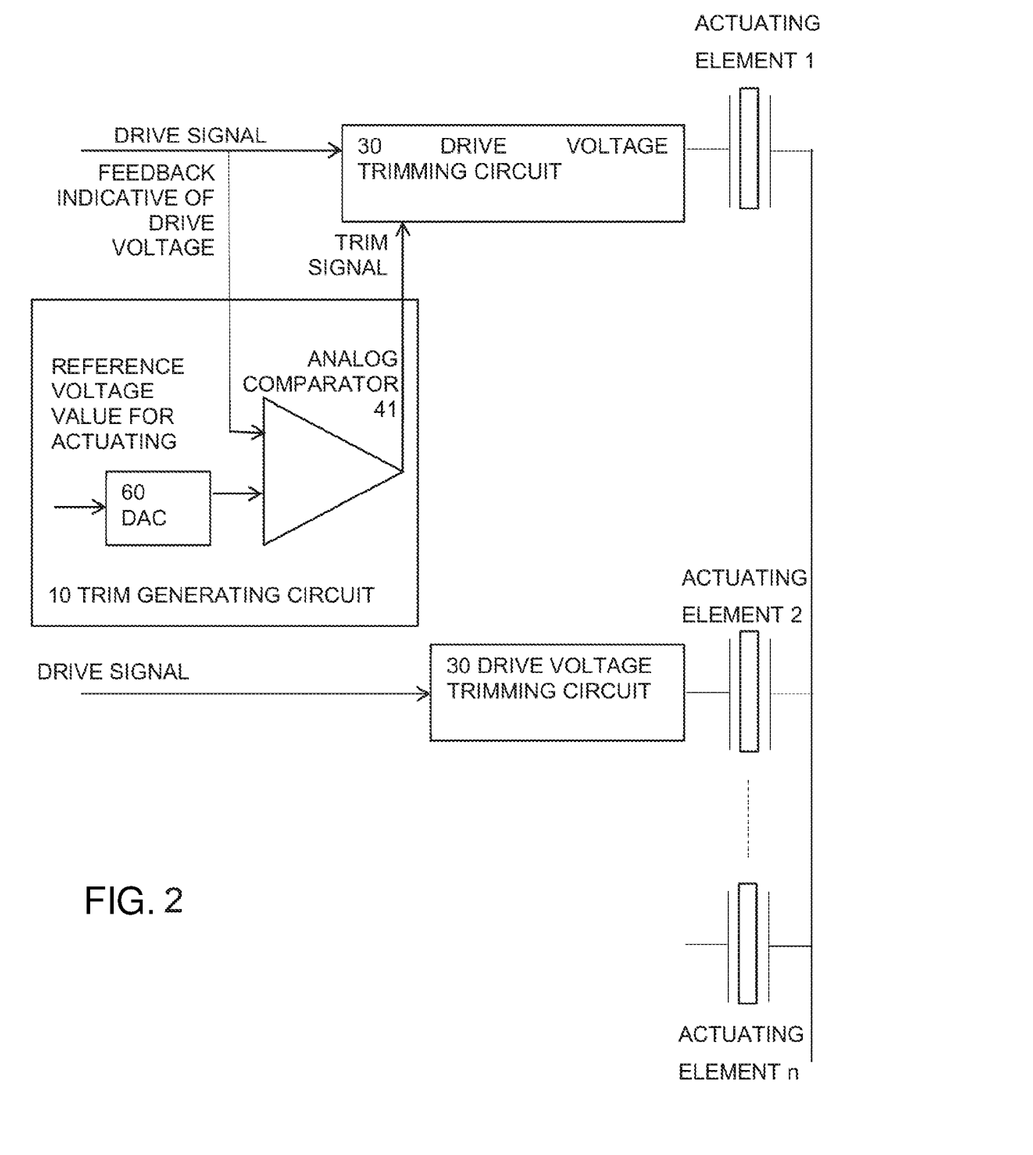
FIG. 2 shows a schematic view of a printhead circuit according to an embodiment having an analog comparator.

FIG. 2, printhead circuit with analog comparator

FIG. 2 shows a schematic view of an embodiment of a printhead circuit similar to that of FIG. 1, and corresponding reference numerals have been used as appropriate. In this case the comparator is an analog comparator 41, and a DAC 60 is provided for converting a digital reference voltage value into an analog signal for input to the analog comparator. The analog output of the comparator can be effectively a logical on or off signal, which can be used to drive digital circuitry, or to drive a transistor for example. There can be a similar trim generating circuit for the second actuating element and for each further actuating element (not shown here for the sake of clarity).

Figure 3:
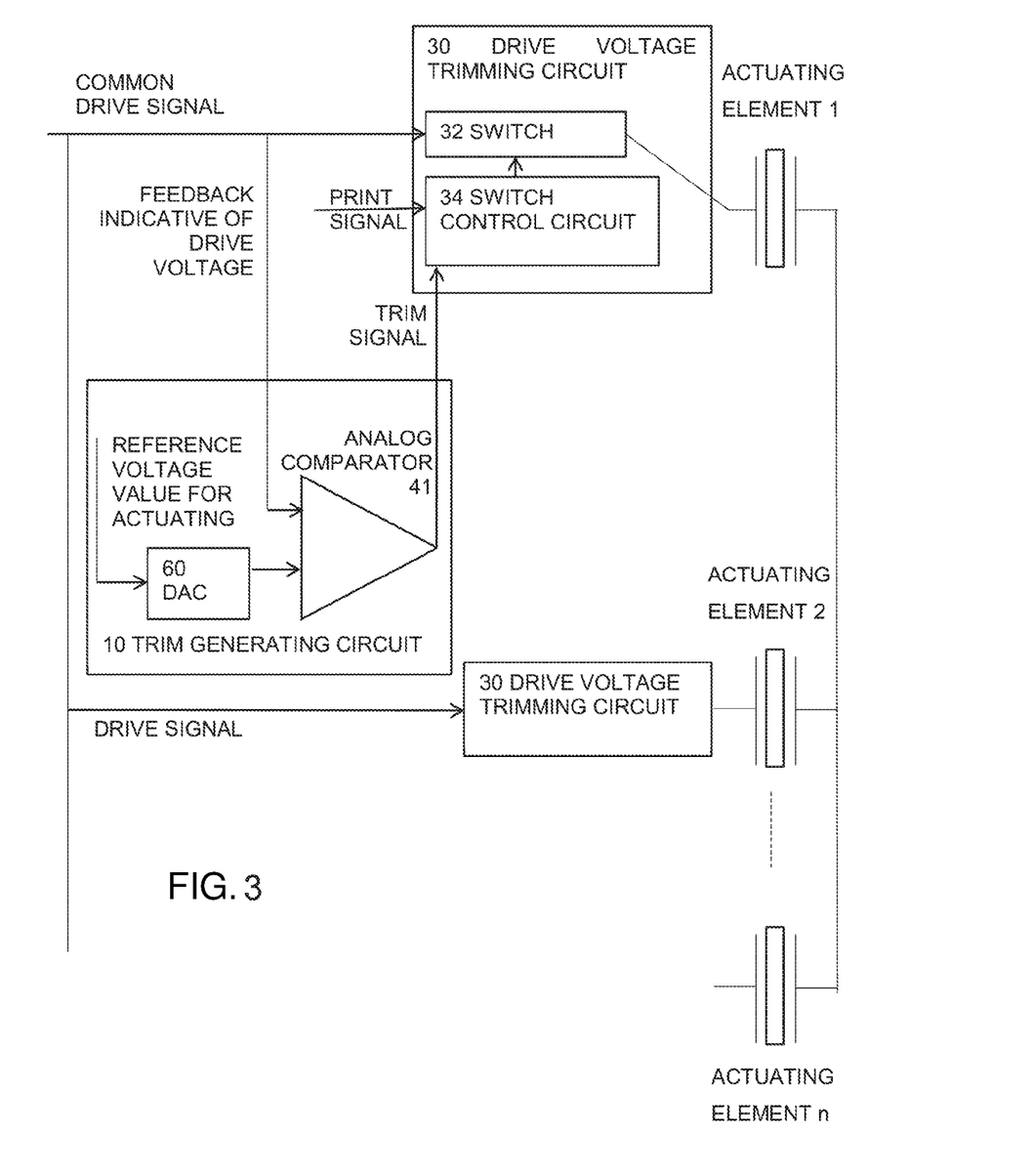
FIG. 3 shows a schematic view of a printhead circuit according to an embodiment having a cold switch.

FIG. 3, printhead circuit with cold switch

FIG. 3 shows a schematic view of an embodiment of a printhead circuit similar to that of FIG. 2, and corresponding reference numerals have been used as appropriate. In FIG. 3, the drive voltage trimming circuit has a switch 32 and a switch control circuit 34. The switch is coupled to a common drive signal and to one electrode of the actuating element, so that when the switch is on, the common drive signal is coupled to drive the actuating element. When the switch is off, the actuating element is disconnected, and the voltage across the actuating element will remain largely unchanged, depending on a capacitance of the actuating element. The switch control circuit 34 is coupled to receive a print signal, to control whether the actuating element prints or not. The switch control part also receives the trim signal, which can be used to adjust the drive signal to adjust the quantity of ink to be used for printing, and this adjustment can in principle be an adjustment of a pulse amplitude. (Note that at least for a cold switch system, there is little or no adjustment of pulse width or slope. A small change in pulse width occurs when the switch is turned off early in the first edge of a drive pulse. But this is a secondary effect on the waveform. The primary trim effect is to reduce the voltage of the pulse. Also, significant adjustment of the slope of the pulse is not done in a cold switch system, since having a different slope from that of the drive amplifier implies that there is a significant voltage drop across the switch element, making the system more "hot" by raising the power dissipation in the demux portion of the system.)

Figure 4:
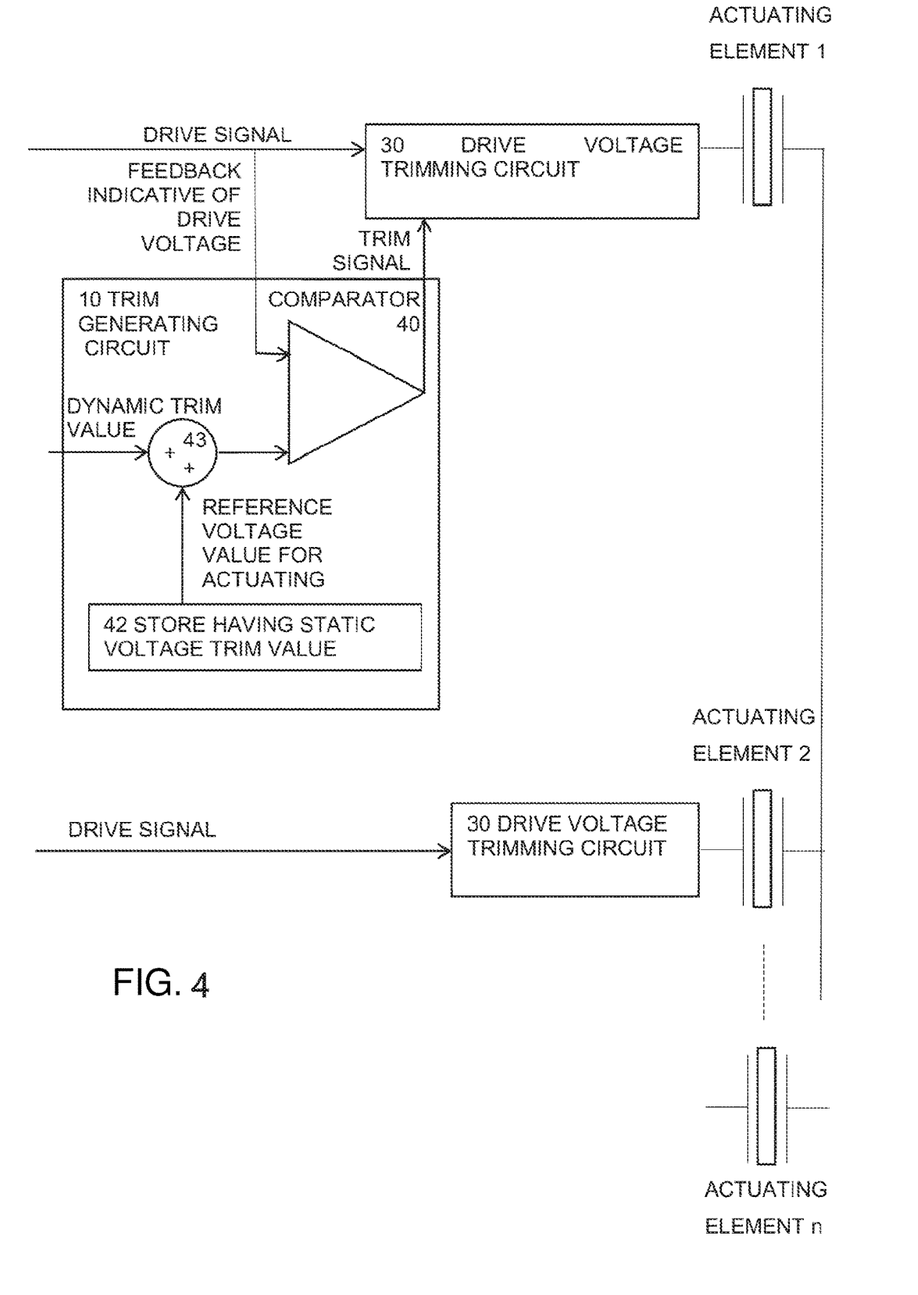
FIG. 4 shows a schematic view of a printhead circuit according to an embodiment having static and dynamic trim.

FIG. 4, printhead circuit with static and dynamic trim

FIG. 4 shows a schematic view of an embodiment of a printhead circuit similar to that of FIG. 1, and corresponding reference numerals have been used as appropriate. In FIG. 4, the trim generating circuit has circuitry for generating the reference voltage value from a dynamic trim value and a static voltage trim value. In this case the static voltage trim value is provided from a store 42, and fed to an adder 43, where it is added to a signal representing a dynamic trim value. This can be generated external to the trim generating circuit, and can be for example a global trim value, a temperature or humidity compensation value, a sub-drop sequence as described below with reference to FIG. 5, or other value, or a combination of these. The static voltage trim value can be a calibration value for the respective actuating element, based on measurements taken at manufacture or commissioning time for example, based on measuring differences in ink output of different actuating elements. There can be a similar trim generating circuit for the second actuating element and for each further actuating element (not shown here for the sake of clarity).

The device can be calibrated for per actuating element voltage trim after assembly into a printhead. If implemented as an ASIC there can be a voltage offset and an adjustment step size that can have significant initial variation. After factory calibration, the voltage offset can be compensated for, along with MEMS actuator variability. The remaining variations can include over supply voltage, temperature and load change (due to aging) for example.

Factory or field static trimming data can be transferred by the system, from a non-volatile memory external to the printhead circuit, through to registers in the trim generating circuit for example using a bidirectional SERIO interface. This can be managed and controlled by a microcontroller external to the printhead circuit for example.

Figure 5:
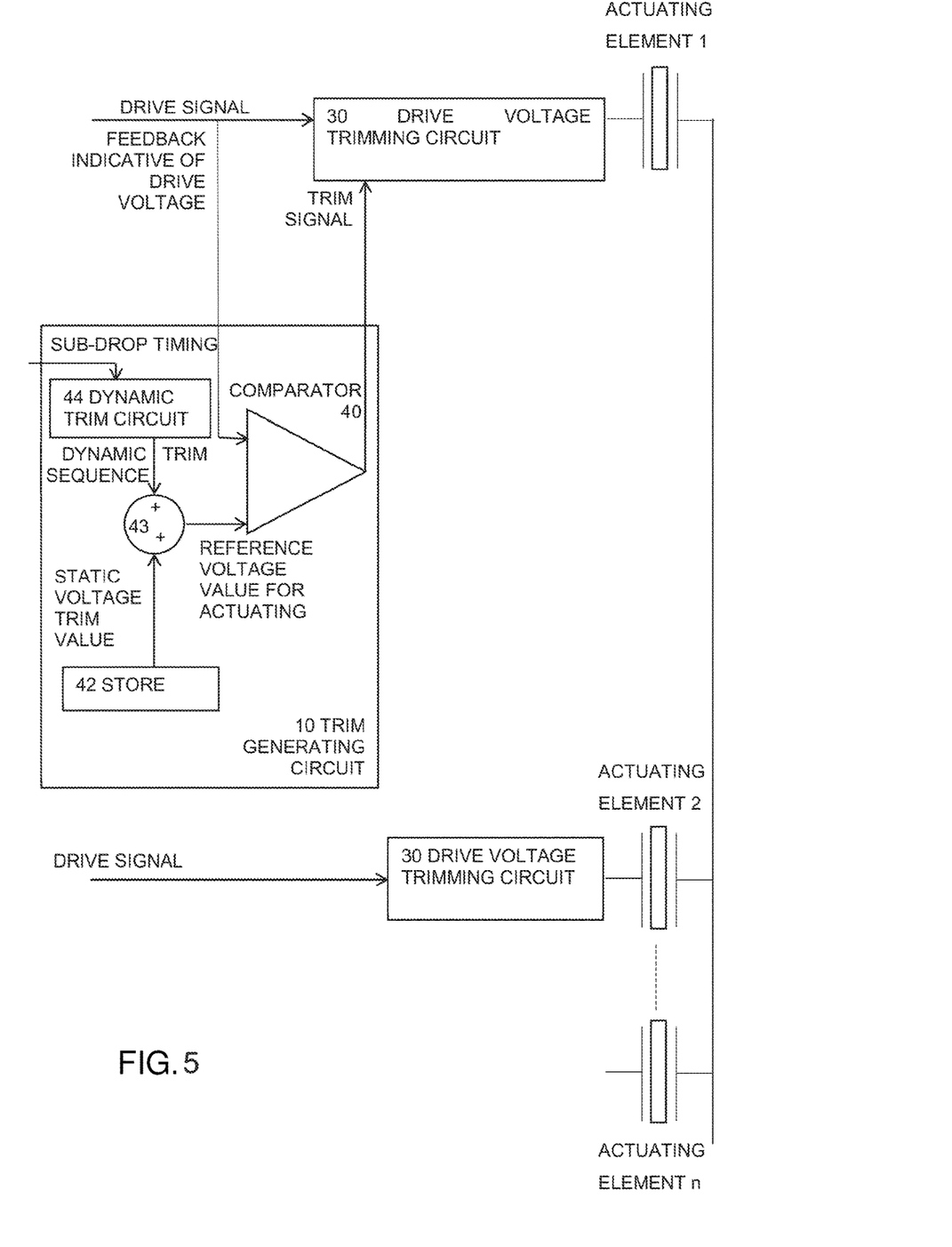
FIG. 5 shows a schematic view of a printhead circuit according to an embodiment having dynamic trim for sub-drops.

FIG. 5, printhead circuit with dynamic trim for sub-drops

FIG. 5 shows a schematic view of an embodiment of a printhead circuit similar to that of FIG. 4, and corresponding reference numerals have been used as appropriate. In FIG. 5, the trim generating circuit has a dynamic trim circuit 44 for generating a dynamic trim sequence based on a sub-drop timing signal. The sub-drops are a sequence of two or more drops making up a drop. The drive signal can effectively be modulated by the trim signal to create the sub-drops, or in principle the drive signal can be generated to have the sub-drops and the trim signal can be used to modulate the sub-drops to provide a predetermined pattern of different quantities of ink from each of the sub-drops. This can enable more possible levels of greyscale from different combinations of the different sub-drops. The desired greyscale value can be encoded in the print signal, if the drive voltage trimming circuit is used to select which of the sub-drops are active, or in principle the desired greyscale value can be incorporated in the sub-drop timing signal, if the dynamic trim circuit or other part in the trim generating circuit is used for selecting which of the sub-drops are active.

Figure 6:
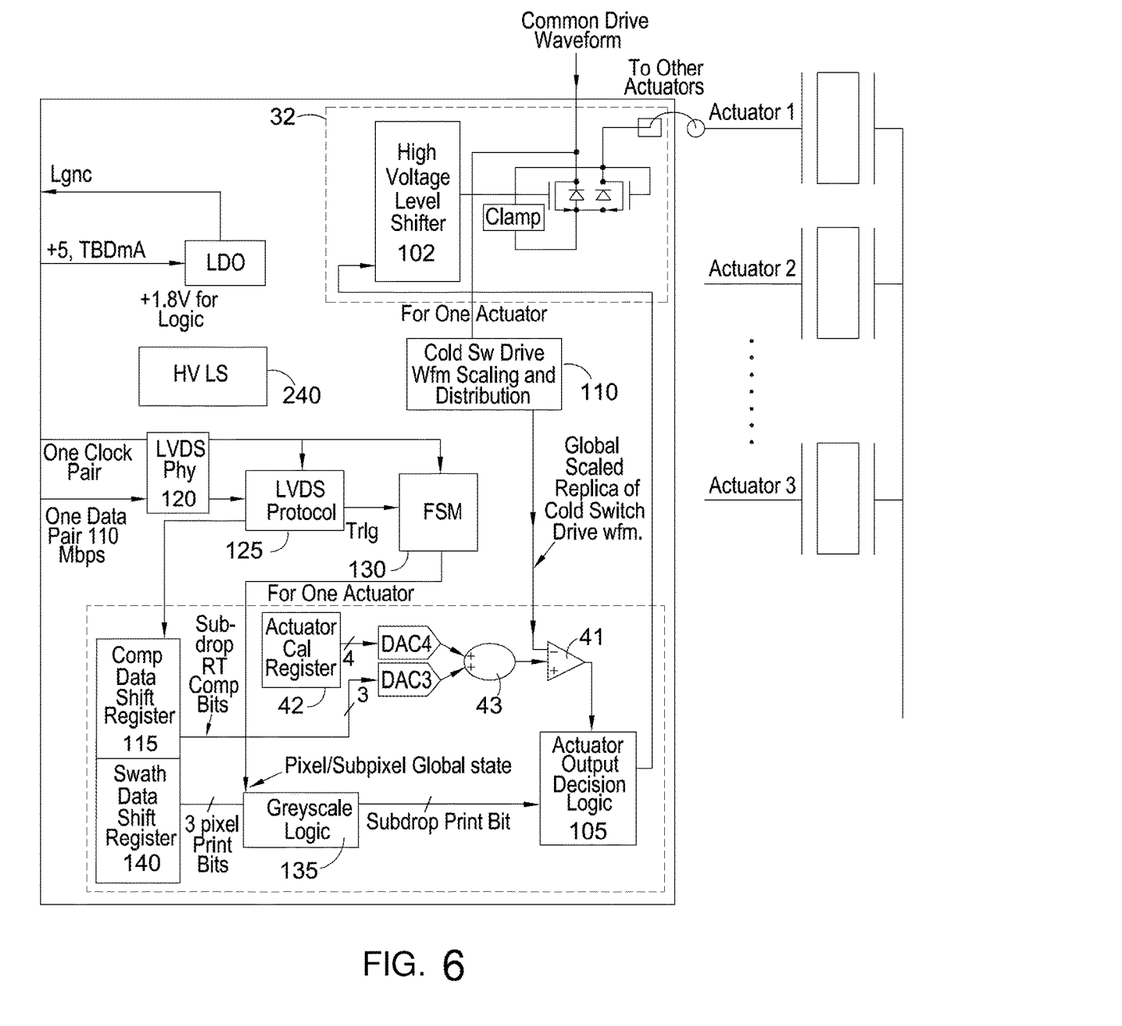
FIG. 6 shows a schematic view of a printhead circuit according to an embodiment implemented in an ASIC.
Figure 7:
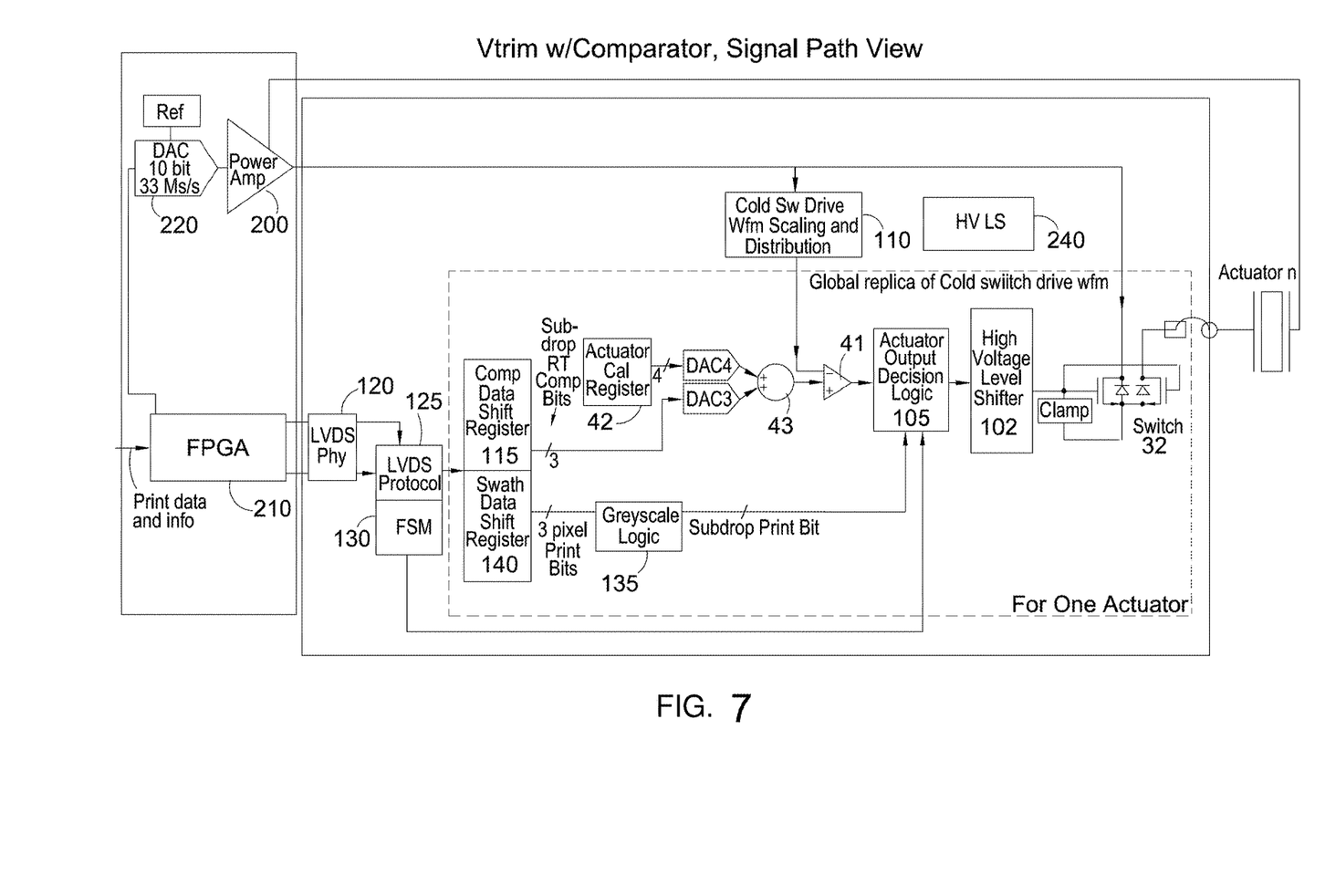
FIG. 7 shows a schematic view of parts of a printer system having the printhead circuit according to an embodiment.

FIGS. 6 and 7, printhead circuit ASIC

FIG. 6 shows a schematic view of a printhead circuit according to another embodiment. This diagram focuses on the elements in the signal path, shown at a block level, implemented as an ASIC (Application Specific Integrated Circuit) (L0). (L0 means "Level Zero" and means the electronics present on the printhead module itself, while Level 1 or L1 indicates electronics on a Printed Circuit Board (PCB) driving multiple printheads) There is a switch 32 implemented in the form of a known pass gate configuration of high voltage transistors at the top right corner. A High voltage level shifter HVLS (High Voltage Level Shifter) 102 is provided to shift a voltage level of a signal for controlling the switch. The switch is coupled in series with an actuating element and a drive signal generator (not shown). A low voltage power supply for digital circuitry is shown (LDO) (Low Drop Out, a common type of voltage regulator).

The ASIC also includes an actuating element output decision logic part 105, fed by a print signal in the form of a sub-drop print bit and fed by an output of a comparator 41. The comparator is fed by a signal indicating drive voltage, from a part 110 labelled Cold switch drive waveform scaling and distribution. The comparator is also fed by the output of adder 43, which is an analog circuit arranged to add analog outputs from DACs 3 and 4. DAC 3 is fed by a digital signal from an external data interface via a compensation data shift register 115. The external data interface includes in this case an LVDS physical interface 120, and an LVDS protocol part 125. The external data interface also has a global FSM (finite state machine) part 130 providing timing and management functions to other parts. DAC 4 is coupled to a store 42 for static trim data in the form of an actuating element calibration register.

The actuating element output decision logic part 105 also has an input of sub-drop print bits in a sequence generated by a greyscale logic part 135. This generates the sequence and selects which sub-drops are active, based on a 3 bit (for example) greyscale signal from a data shift register 140 (labelled Swath).

FIG. 7 shows a schematic view of parts of a printer assembly for a printer, and having the printhead circuit of FIG. 6 and other parts according to an embodiment. Corresponding reference numerals have been used as appropriate. In FIG. 7 the printer assembly has the printhead circuit and an external card in the form of a PCB L1. This has a drive signal generator in the form of power amp 200, fed by a digital output of an FPGA (field programmable gate array) 210, via a DAC 220. The same FPGA also processes print information to provide the print signal for the printhead circuit, via the LVDS (Low Voltage Differential Signalling, a common method of low cost high speed data transmission) data interface. The print information may comprise a file of data for printing received at the FPGA from a personal computer or from a network connection for example.

The FPGA in this case provides at least three data streams as follows. A first is samples to drive the DAC (Digital to analog converter) to provide a waveform to the power amp. (A baseline function in cold switch systems). A second is print data to tell the printhead when to fire a drop out of which actuating elements, and a third is real time voltage trimming data to be applied in addition to static, calibrated individual actuating element trimming data. Then, in the ASIC, the print data and trimming data are provided to each actuating element circuit. Then at each actuating element, the print data are used to determine if a droplet should fire. The real time voltage trimming value of each sub-drop pulse from the "Comp Data Shift Register" goes into the DAC3 and comes out as a charge value which is shared with the charge from the DAC4. The DAC4 digital input is set by a per actuating element register that sets the actuating element static calibration value. The two DACs have their values added together with scaling determined by charge sharing. Thus the two digital values from the registers are simultaneously scaled and added to provide a voltage to the comparator. The comparator essentially identifies when the scaled waveform voltage is greater than the voltage output from the DACs. The digital output of this comparator is fed to actuating element decision logic to allow or prevent firing of the actuating element depending on print data. Then the output of actuating element decision logic is fed to a high voltage level shifter which applies or removes a bias onto an LDMOS pair in this example (A "Cold Switch" arrangement) to set the trimming voltage.

In some embodiments it is feasible to add a "High Voltage Level Shifter" circuit 240 that uses a "temperature compensating" section to vary the bias currents utilized in the "High Voltage Level Shifter" so as to provide a consistent delay between high and low temperature range operation, and hence a consistent trim voltage, since any delay in turning on will produce an undesirable increase in the voltage of a pulse.

Figure 8:
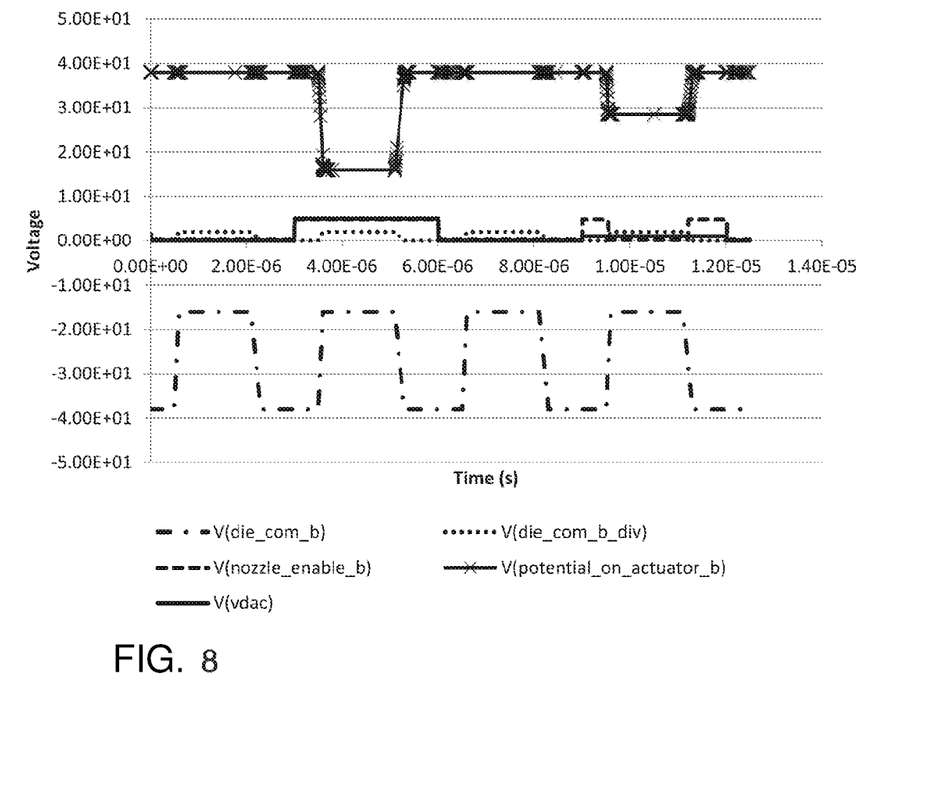
FIGS. 8 and 9 show waveforms in operation of embodiments.
Figure 9:
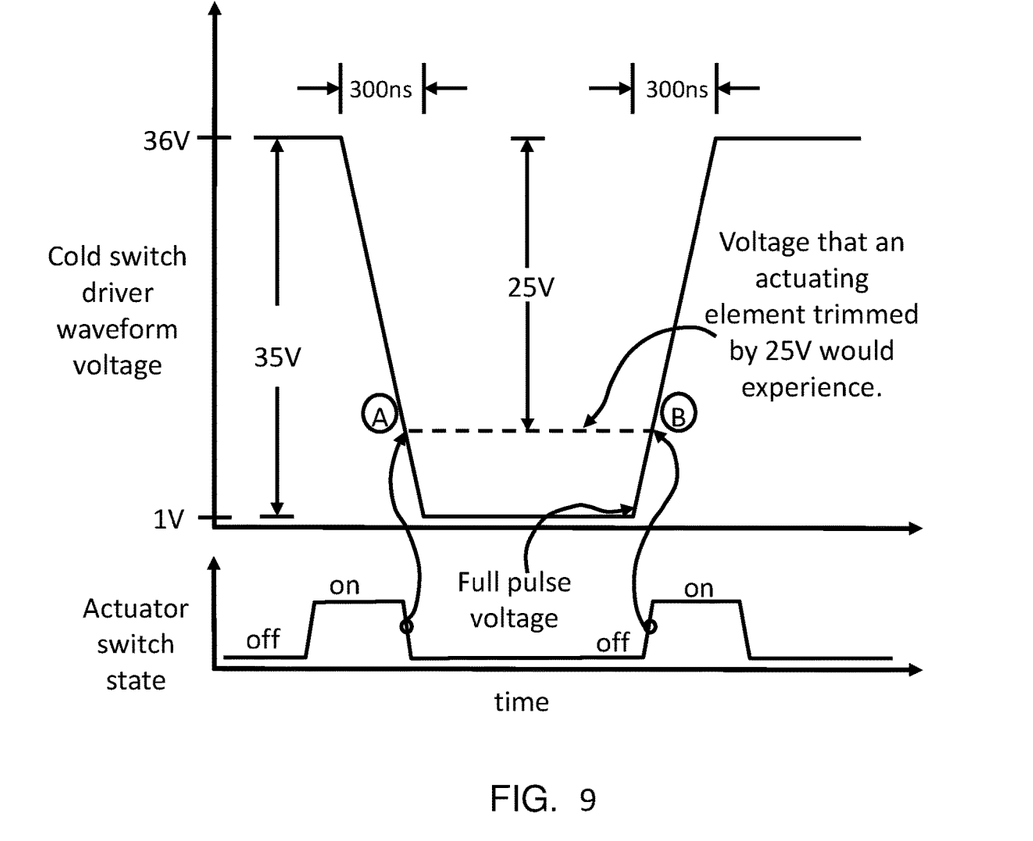

FIGS. 8, 9, waveforms in operation

FIG. 8 shows five waveforms during operation of an embodiment. The dotted trace V(die_com_b_div) shows four regular pulses, and is a scaled and offset copy of the common drive signal before any switching. It is the waveform at one of the inputs of the comparator 40 or 41 described above. The dot-dash trace V(die_com_b) shows the actual, full magnitude and non-voltage offset actual common drive signal. Note that these drive waveforms are shown for an example using an "Open Drain" type of switching, rather than the pass gate type switch shown in FIGS. 6 and 7. The waveforms for the pass gate would differ in that the gate voltage applied to the pass gate would be level shifted to, and relative to the source voltage of the switching transistors used in it, but otherwise have the same timing and magnitude as the open drain design would have, relative to each switching transistor's source terminal. The solid line trace with crosses "V(potential_on_actuator b)" is the actual potential across the actuating element actuator being driven and trimmed. This trace shows how the first pulse is not selected, the second pulse is put through at maximum voltage, the third pulse is not selected, and the fourth pulse is trimmed to about half magnitude. The solid line trace "V(vdac)" shows how the DAC output from DAC 60 in FIG. 3, or from the addition of outputs of DAC3 and DAC4 in FIG. 6 or 7, as fed to comparator 40 or 41, is varied to allow for not firing an actuating element (0-3 us and 6-9 us), firing at full voltage (3-6 us), or trimming at a desired voltage (9-12 us). The dashed line waveform "V(actuating element_enable_b)" is the trim signal output by the comparator 40 or 41, which controls the switch. Note where it is OFF completely (0-3 us and 6-9 us), ON completely (3-6 us), or ON and OFF at certain times to trim at a desired voltage (9-12 us).

In the waveform shown in FIG. 8, Vdac is kept at a low level when an actuating element is desired to be off, such as when a print signal indicates no pixel is to be printed, for example by coupling the print signal to a DAC output enable. Alternatively the same effect can be achieved in various ways, such as by gating the output of the comparator with a print signal, as shown in FIG. 3 for example or using the actuating element output decision logic 105 of FIG. 6 or FIG. 7. Then the output to control the switch is low for the duration of the pulse, never turning the switch on. Then it is desired to turn on an actuating element and trim the drive voltage to the element, then Vdac is set to a level that matches the desired scaled voltage. The switch is turned on before the pulse in the common drive waveform, and then turned off just as the pulse gets to the desired level. On the return, when the common drive waveform goes back down, the reverse sequence happens and the switch is turned back on at the point at which the common drive waveform closely matches the voltage value across the actuator.

FIG. 9 shows a single pulse of the common drive waveform showing the effect of controlling the timing of switching. This shows a cold switch driver (also referred to as common drive) waveform and shows a dotted line A-B showing the effect of trimming the voltage level to or by 25 v rather than the untrimmed 35 v. These voltages can be selected according to the type of actuator or actuating element. In this case the pulse slopes are 300 ns long though other values can be chosen. Below is a corresponding waveform of the actuating element switch state which corresponds to the control provided by the trim signal. When the actuating element switch is on, the voltage across the actuating element will follow the common drive waveform. When the actuating element switch state is off, the voltage across the actuating element will remain roughly constant. Hence in the example shown, the actuating element state is on for most of the downgoing slope, until the waveform has changed to 25 v, at point A. Then the actuating element state is switched off, triggered by the comparator. This means the voltage across the actuating element follows the dotted line, rather than following the solid line. At point B, the comparator changes output again and the actuating element switch state changes to the on state. The voltage across the actuating element follows the upgoing slope of the common drive waveform. Note that although the trimming is made by altering the timing of the change of switch state, the trigger for deciding when to change state is made by the comparator detecting a voltage level, rather than by an entirely digital circuit determining timing.

Figure 10:
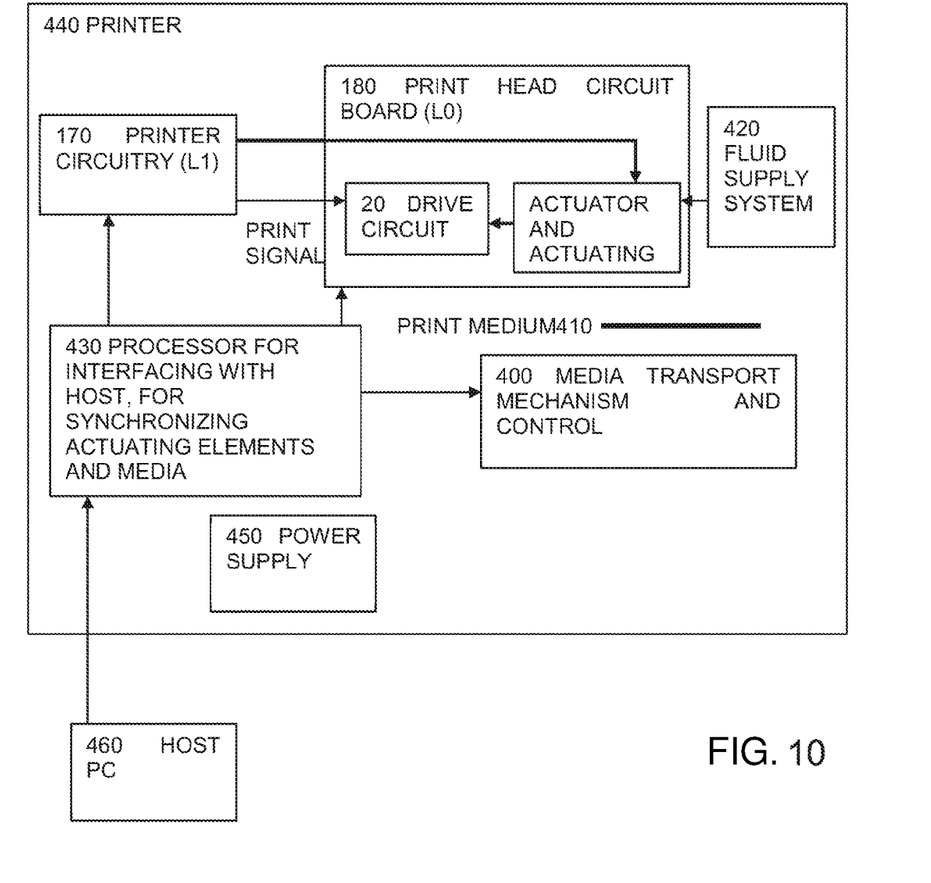
FIG. 10 shows a printer according to an embodiment.

FIG. 10 embodiment showing printer features

The printhead embodiments described above can be used in various types of printer.

Two notable types of printer are:

a) a page-wide printer (where printheads cover the entire width of the print medium, with the print medium (tiles, paper, fabric, or other example) rolling under the printheads), and b) a scanning printer (where a bundle of printheads slide back and forth on a printbar, whilst the print medium rolls forward in increments under the printheads, and being stationary whilst the printhead scans across). There can be large numbers of printheads moving back and forth in this type of arrangement, for example 16 or 32, or other numbers. In both scenarios, the printheads can optionally be operating several different colours, plus perhaps primers and fixatives or other special treatments. Other types of printer can include 3D printers for printing fluids such as plastics or other materials in successive layers to create solid objects.

FIG. 10 shows a schematic view of a printer 440 coupled to a source of data for printing, such as a host PC 460 (which can be external or internal to the printer). The printhead circuit 5 of FIG. 1 corresponds to drive circuit 20 shown on printhead circuit board (L0) 180 together with one or more actuators and actuating elements 110. Printer circuitry (L1) 170 is configured to generate the common drive waveform for input to the printhead circuit board, and together they form a printer assembly. They can be coupled to a processor 430 for interfacing with the host, and for synchronizing drive of actuators and location of the print media. This processor is coupled to receive data from the host, and is coupled to the printhead circuit board to provide synchronizing signals at least. The printer also has a fluid supply system 420 coupled to the actuating elements, and a media transport mechanism and control part 400, for locating the print medium 410 relative to the actuating elements. This can include any mechanism for moving the actuating elements, such as a movable printbar. Again this part can be coupled to the processor to pass synchronizing signals and for example position sensing information. A power supply 450 is also shown, for supplying power to the various parts of the printer (supply connections are omitted from the FIG. for the sake of clarity).

The printer can have a number (for example seven) of inkjet printheads attached to a rigid frame, commonly known as a print bar. The media transport mechanism can move the print medium beneath or adjacent the print bar. A variety of print media may be suitable for use with the apparatus, such as paper sheets, boxes and other packaging, or ceramic tiles. Further, the print media need not be provided as discrete articles, but may be provided as a continuous web that may be divided into separate articles following the printing process.

The printheads may each provide a linear array of fluid chambers having respective actuating elements for ink droplet ejection, with the actuating elements in each linear array evenly spaced. The printheads can be positioned such that the actuating element arrays are parallel to the width of the substrate and also such that the actuating element arrays overlap in the direction of the width of the substrate. Further, the actuating element arrays may overlap such that the printheads together provide an array of actuating elements that are evenly spaced in the width direction (though groups within this array, corresponding to the individual printheads, can be offset perpendicular to the width direction). This may allow the entire width of the substrate to be addressed by the printheads in a single printing pass.

The printer can have circuitry for processing and supplying image data to the printheads. The input from a host PC for example may be a complete image made up of an array of pixels, with each pixel having a tone value selected from a number of tone levels. In the case of a colour image there may be a number of tone values associated with each pixel: one for each colour. In the case of CMYK printing there will therefore be four values associated with each pixel, with tone levels 0 to 255 being available for each of the colours.

Typically, the printheads will not be able to reproduce the same number of tone values for each printed pixel as for the image data pixels. For example, even fairly advanced greyscale printers (which term refers to printers able to print dots of variable size, rather than implying an inability to print colour images) will only be capable of producing 8 tone levels per printed pixel. The printer may therefore convert the image data for the original image to a format suitable for printing, for example using a half-toning or screening algorithm. As part of the same or a separate process, it may also divide the image data into individual portions corresponding to the portions to be printed by the respective printheads. These packets of print data may then be sent to the printheads.

The fluid supply system can provide ink to each of the printheads, for example by means of conduits attached to the rear of each printhead. In some cases, two conduits may be attached to each printhead so that in use a flow of ink through the printhead may be set up, with one conduit supplying ink to the printhead and the other conduit drawing ink away from the printhead.

In addition to being operable to advance the print articles beneath the print bar, the media transport mechanism may include a product detection sensor (not shown), which ascertains whether the print medium is present and, if so, may determine its location. The sensor may utilise any suitable detection technology, such as magnetic, infra-red, or optical detection in order to ascertain the presence and location of the substrate.

The print-medium transport mechanism may further include an encoder (also not shown), such as a rotary or shaft encoder, which senses the movement of the print-medium transport mechanism, and thus the substrate itself. The encoder may operate by producing a pulse signal indicating the movement of the substrate by each millimeter. The Product Detect and Encoder signals generated by these sensors may therefore indicate to the printheads the start of the substrate and the relative motion between the printheads and the substrate.

The processor can be used for overall control of the printer systems. This may therefore co-ordinate the actions of each subsystem within the printer so as to ensure its proper functioning. It may, for example signal the ink supply system to enter a start-up mode in order to prepare for the initiation of a printing operation and once it has received a signal from the ink supply system that the start-up process has been completed it may signal the other systems within the printer, such as the data transfer system and the substrate transport system, to carry out tasks so as to begin the printing operation.

Concluding Remarks

Various embodiments can have some or all of the following effects:

1. In some cases voltage trimming can be applied to a cold switch arrangement.
2. In some cases power dissipation in a cold switch design can be improved.
3. Lower cost than other types of trimming.
4. No requirement for fast ASIC wide clocks and associated actuating element fast digital counter timing circuits for triggering the voltage changes to trim the drive signals, which can result in lower cost designs.
5. As resolution is increased, ASIC costs do not need to rise as quickly as would occur using counter based digital timing for triggering voltage level changes.

Other embodiments and variations can be envisaged within the scope of the claims.

The invention claimed is:

1. A printhead circuit for driving at least two actuating elements and comprising a trim generating circuit and a trimming circuit, the trim generating circuit being configured to generate a trim signal for trimming a drive voltage of at least one of the actuating elements relative to other actuating elements, the trim generating circuit having a comparator coupled to receive and compare feedback indicative of a present level of a drive voltage, with a configurable reference voltage value for the at least one of the actuating elements, and the trim generating circuit being configured to generate the trim signal according to the comparison, the trimming circuit being coupled to receive the trim signal and being configured to trim the drive voltage of the respective at least one of the actuating elements according to the trim signal, the comparator comprising an analog comparator circuit arranged to receive the feedback as an analog signal and having a digital to analog converter for converting the reference voltage value into an analog signal for input to the analog comparator.

2. The printhead circuit of claim 1 and the trimming circuit having a switch for applying a drive signal to cause the drive voltage across the actuating element, and the printhead circuit having a control circuit for controlling the switch according to a print signal and according to the trim signal.

3. The printhead circuit of claim 2, the control circuit being arranged to adjust a timing of the switch control according to the trim signal.

4. The printhead circuit of claim 2, the drive signal being a common drive signal for multiple of the actuating elements and the switch being provided one per actuating element, to switch the common drive signal to a respective one of the actuating elements.

5. A printhead driver assembly having the printhead circuit of claim 1, and having a common drive circuit for generating the drive voltage.

6. The printhead driver assembly of claim 5, the feedback being coupled from the common drive circuit for generating the drive voltage.

7. A printhead including the printhead circuit of claim 1.

8. A printhead circuit for driving at least two actuating elements and comprising a trim generating circuit and a trimming circuit, the trim generating circuit being configured to generate a trim signal for trimming a drive voltage of at least one of the actuating elements relative to other actuating elements, the trim generating circuit having a comparator coupled to receive and compare feedback indicative of a present level of a drive voltage, with a configurable reference voltage value for the at least one of the actuating elements, and the trim generating circuit being configured to generate the trim signal according to the comparison, the trimming circuit being coupled to receive the trim signal and being configured to trim the drive voltage of the respective at least one of the actuating elements according to the trim signal, the trim generating circuit comprising a store for providing a static trim value, and a circuit for combining the static trim value with a dynamic trim value.

9. The printhead circuit of claim 8, the trim generating circuit having a dynamic trim circuit configured to receive a sub-drop timing signal and to generate the dynamic trim value as a sequence of values corresponding to a sequence of sub-drops within a drop, according to the sub-drop timing signal.

10. A trim generating circuit for generating a trim signal for trimming a drive voltage applied to at least one of a plurality of actuating elements, the trim generating circuit having a comparator coupled to receive and compare feedback indicative of a present level of a drive voltage, with a configurable reference voltage value for the at least one of the actuating elements, the trim generating circuit being configured to generate the trim signal according to the comparison, and the comparator comprising an analog comparator circuit arranged to receive the feedback as an analog signal and having a digital to analog converter for converting the reference voltage value into an analog signal for input to the analog comparator.

* * * * *